(12) United States Patent  (10) Patent No.: US 7,816,814 B1
Hennessy et al.  (45) Date of Patent: Oct. 19, 2010

(54) BI-DIRECTIONAL POWER CONVERTERS

(76) Inventors: Michael J. Hennessy, 9 Patroon Pl., Ballston Lake, NY (US) 12019; Eduard K. Mueller, 20 McCormicks La., Ballston Lake, NY (US) 12019; Richard Ross Neal, 6A Sylvan Trail, Ballston Lake, NY (US) 12019

( * ) Notice: Subject to any disclaimer, the term of this patent is extended or adjusted under 35 U.S.C. 154(b) by 429 days.

(21) Appl. No.: 11/894,068

(22) Filed: Aug. 20, 2007

Related U.S. Application Data

(60) Provisional application No. 60/838,631, filed on Aug. 18, 2006.

(51) Int. Cl.
*H01H 9/00* (2006.01)
(52) U.S. Cl. ...................................... 307/112
(58) Field of Classification Search ................. 307/112, 307/113, 115, 125; 327/389, 434
See application file for complete search history.

(56) References Cited

U.S. PATENT DOCUMENTS

| | | | | |
|---|---|---|---|---|
| 4,683,387 A * | 7/1987 | Jones et al. | ................. | 327/424 |
| 6,172,550 B1 * | 1/2001 | Gold et al. | ................. | 327/366 |
| 6,747,391 B1 * | 6/2004 | Ben-Yaakov | ........... | 310/316.01 |
| 6,956,426 B2 * | 10/2005 | Wodnicki | ................... | 327/382 |
| 7,391,133 B1 * | 6/2008 | Hennessy et al. | ........... | 307/113 |

\* cited by examiner

*Primary Examiner*—Albert W Paladini
(74) *Attorney, Agent, or Firm*—Leonard Cooper

(57) ABSTRACT

A bi-directional power converter for cryogenic operation based on a bi-directional cryo-MOSFET switch. Cryogenic power electronics lends itself easily to bi-directional topologies, and brings higher efficiencies, further reductions in switching speed, higher-frequency operation, reduction in size and weight of associated transformers and inductors, and reductions in overall size and weight. In addition, cryogenic power electronics operating around liquid nitrogen temperatures is easily integrated with superconducting motors, motor drives, and transformers, all of which can reduce size and weight of shipboard power systems, allowing for greater payload.

6 Claims, 4 Drawing Sheets

BI-DIRECTIONAL POWER CONVERTERS

This application claims the benefit of provisional application No. 60/838,631 filed on Aug. 18, 2006, now pending.

BACKGROUND OF THE INVENTION

MTECH Laboratories (Ballston Spa, N.Y.) has developed a number of prototype cryogenic power unidirectional converters for the military. The converters were operated at liquid nitrogen temperature targeting second-generation HTS superconductors and devices. These converter programs have led to several key innovations and advances, such as the development of novel switching topologies, high-speed power busses and cryogenic multi-chip modules to optimize commercially available power devices for low-temperature operation. MTECH's cryogenic power technologies should lead to innovative lightweight, small, and highly efficient bi-directional converters.

For low temperature operation, MTECH has utilized cryogenic MOSFETs, MTECH having more than 30 man-years of combined practical experience in working them into functional devices. The reason cryogenic MOSFETs are preferred is the dramatic reduction in on-state resistance and switching times at low temperatures. MTECH has qualified a select number of commercially available MOSFETs as "cryogenic MOSFETs" and offers them commercially through its subsidiary Cryocircuits, LLC. The performance of one such device is illustrated in FIG. 2, which shows the performance of a cryo-MOSFET, namely, on-resistance, as a function of drain current; and shows a nearly 40-times improvement between 400 K and 77 K at low currents. (Note also that this 28 ampere device can be operated to currents up to 165 amperes at 77 K, with only a minimal increase in on-state resistance.)

MTECH found that there is an optimal balance between size/weight and losses/efficiency, as shown in the optimization curve of FIG. 1. FIG. 1 is a graph illustrating optimization of cryogenic power systems, a tradeoff between electronic component size and refrigerator size.

SUMMARY OF THE INVENTION

Bi-directional converters require high performance bi-directional switches. Bi-directional switches can be formed by connecting devices back to back, as shown in the test circuit in FIG. 3, which is configured with MOSFETs. Similar switches can be formed with IGBTs. FIG. 3 is a cryogenic bi-directional switch test circuit in accordance with the invention. The lowest bi-directional on-state voltage is obtained when both MOSFETs are turned on. When both are off, current is blocked in both directions.

DESCRIPTION OF PREFERRED EMBODIMENTS

Bi-directional converters require high performance bi-directional switches. Bi-directional switches can be formed by connecting devices back to back, as shown in the test circuit in FIG. 3, which is configured with MOSFETs. Similar switches can be formed with IGBTs.

Figure 3:
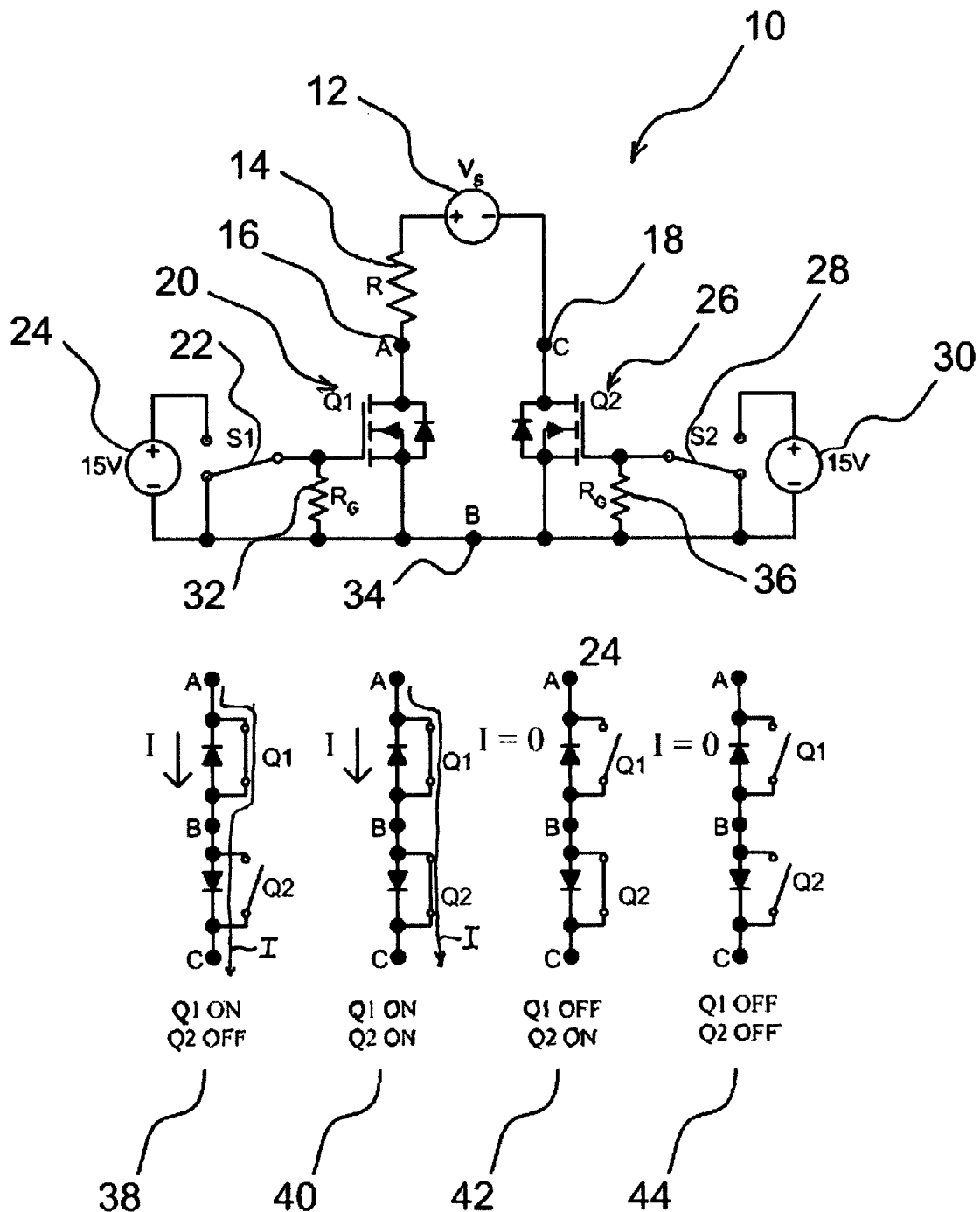
FIG. 3 is a cryogenic bi-directional switch test circuit in accordance with the invention.

With reference to the Figures, the bi-directional switch 10 includes two electrically controlled switch elements Q1, Q2, 20, 26, which are shown as MOSFETs in FIG. 3. (These elements can also be IGBTs.) The switches are controlled by gate voltages 24, 30 respectively.

In the ON STATE of the switch 10, the control voltages 24, 30 are applied to the gates of the switches 20, 26, respectively, through the switches 22, 28 when in their (as illustrated) upper (+) position. In this state the switch 10 passes current through the resistor 14 (load) which is supplied by the source voltage 12. Even if the polarity of the source 12 is reversed, current will pass through R, Q1, Q2, 14, 20, 26. Accordingly, source 12 in another embodiment in accordance with the invention may be an AC source.

In the OFF STATE the switches 22, 28 are in the lower illustrated (−) position and no current flows through the resistance R 14. In practice, switches 22, 28 are electrically controlled integrated circuit drivers which have a high and a low state designed to turn on MOSFETs 20, 26.

The circuits 38, 40, 42, 44 are simplified equivalent circuits between nodes A, B, C (16, 34, 18), which describe the configurations of the switch 10 when using two power MOSFETs 20, 26. When MOSFETs 20, 26 are both turned on by switches 22, 28 respectively, the equivalent circuit is 40, where I is the current flowing through resistance 14. In this mode, the on-state voltage between nodes 16 and 18 is the lowest. The body diodes inherent in the MOSFETs 20, 26 are effectively shunted, leading to a very low on-state voltage, which is shown in FIGS. 4A, B.

Figure 4A:
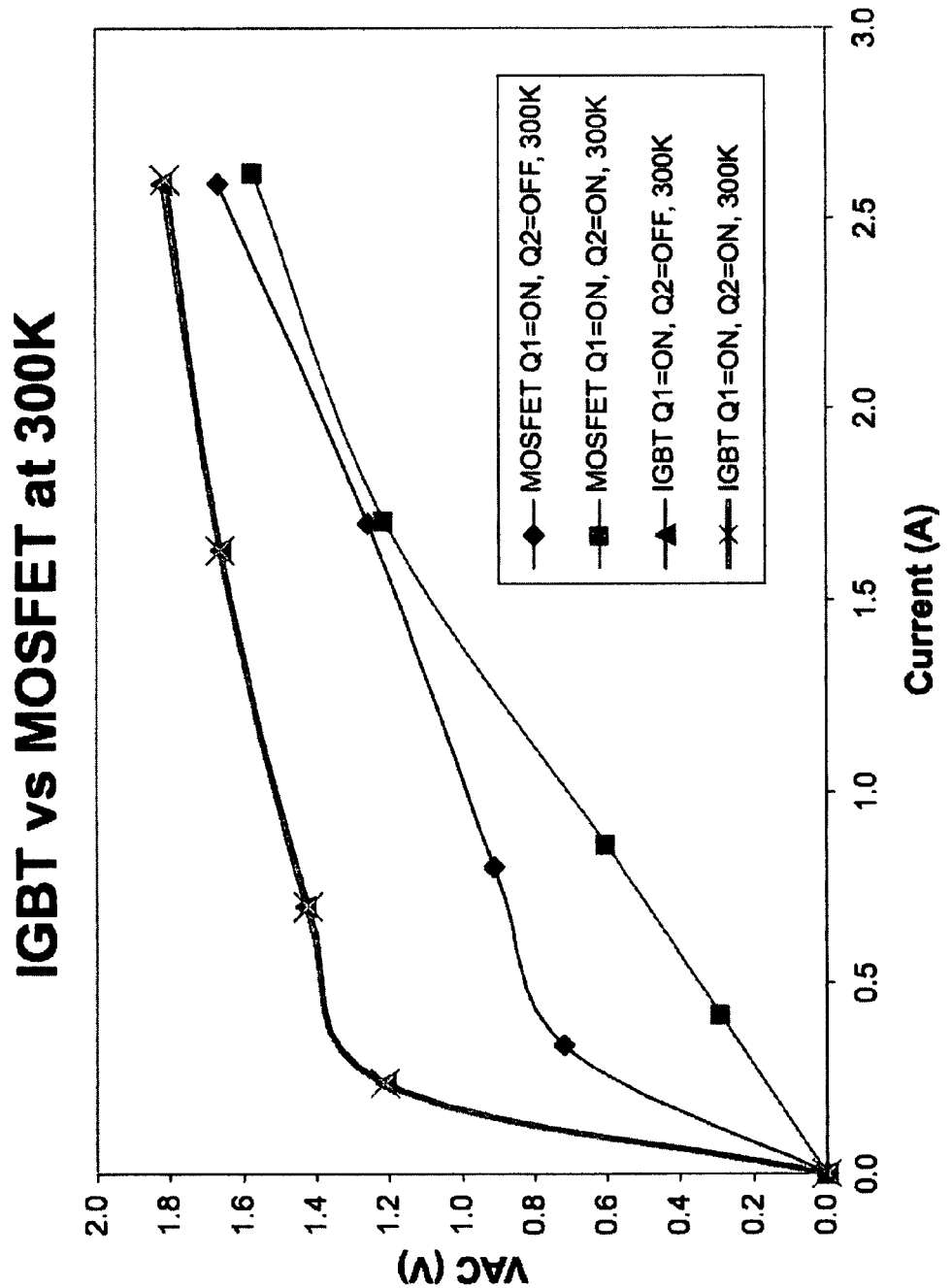
FIGS. 4A and 4B are graphs of forward drop vs. current for Cryogenic Bi-directional switches at different temperatures.

FIGS. 4A, B show test results for IGBTs and MOSFETS for test circuit 10. Test results are shown for various "ON" configurations for the switches 20, 26. The lowest on-state voltage is exhibited by MOSFETS at room temperature and 77K when both switches 20, 26 are turned on as illustrated by the equivalent circuit 40. The 77K on-state voltage is dramatically lower than the corresponding test at 300K, leading to ultra-low conduction losses and high efficiencies.

Figure 4B:
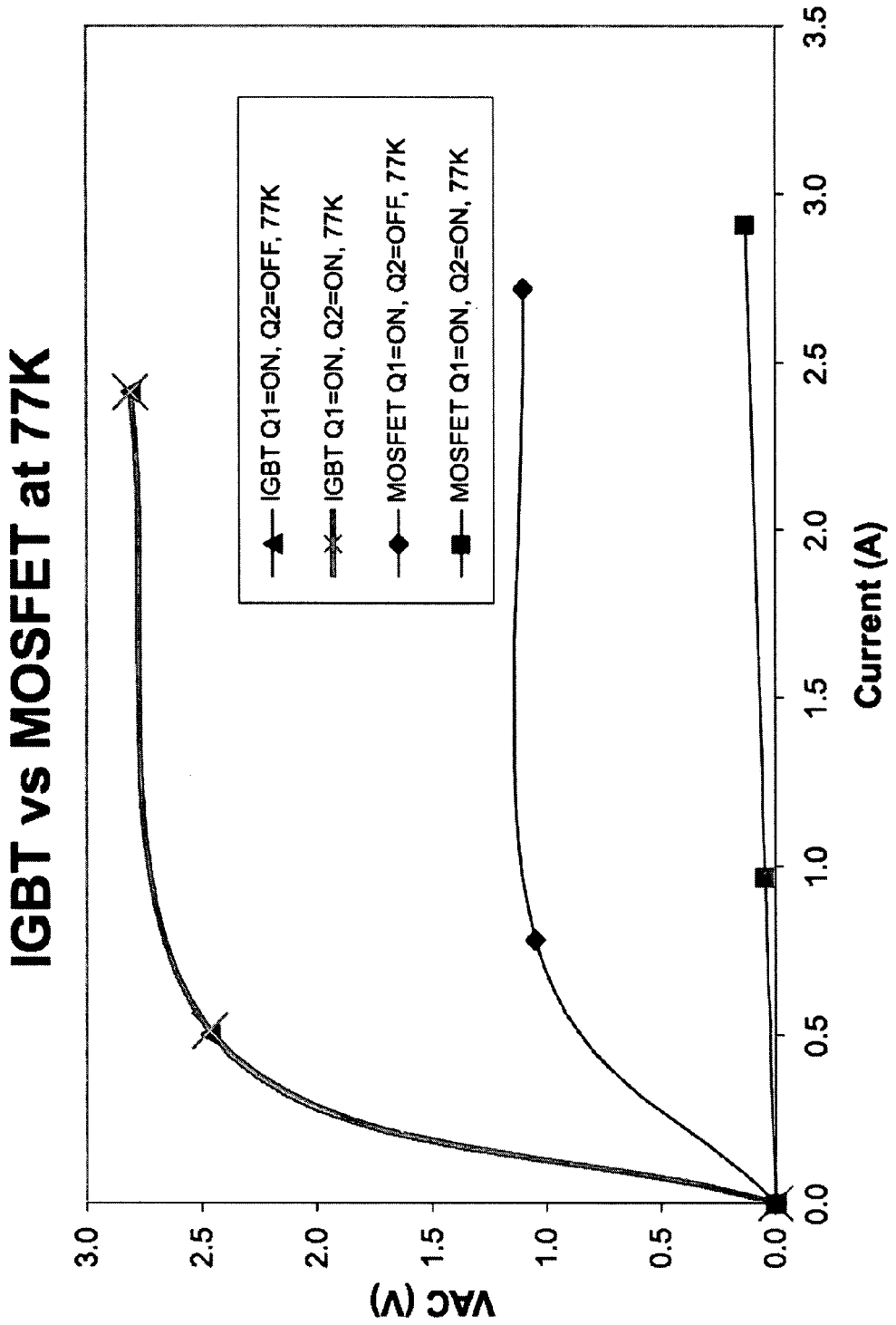

The inventors conducted a series of tests on these devices configured as in FIG. 3, summarized in FIGS. 4A, B. The lowest bi-directional on-state voltage is obtained when both MOSFETs are turned on. When both are off, current is blocked in both directions. FIGS. 4A and 4B are graphs of forward voltage drop vs. current for cryogenic bi-directional switches at different temperatures. The MOSFET construction has the least forward voltage drop (and hence least power dissipation) when both gates are turned on. This effect, though not as significant at room temperature, is useful at cryogenic temperatures.

Figure 1:
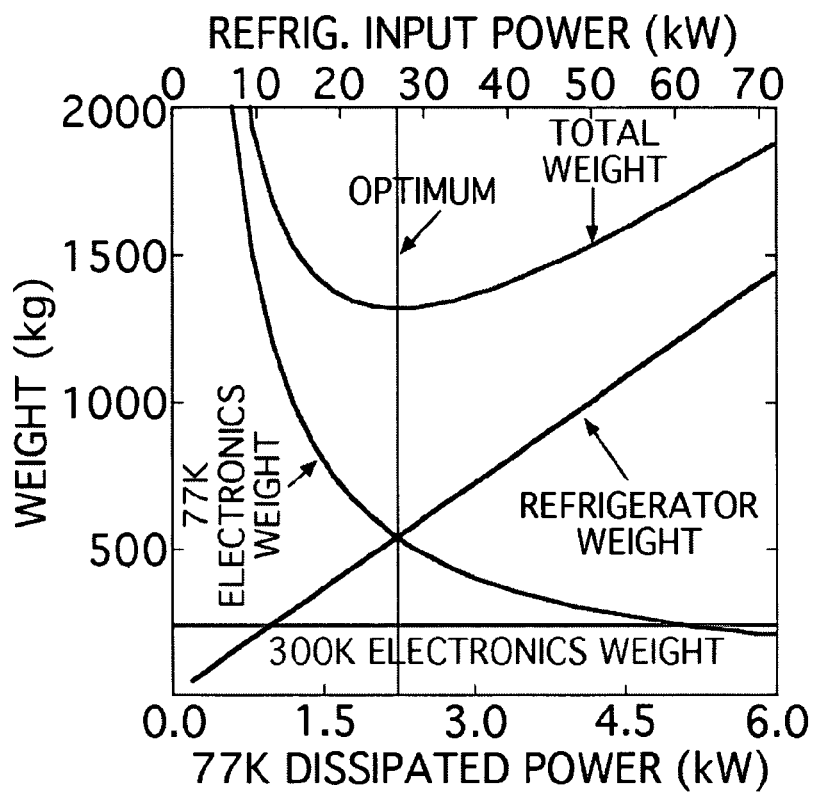
FIG. 1 is a graph illustrating optimization of cryogenic power systems, a tradeoff between electronic component size and refrigerator size.
Figure 2:
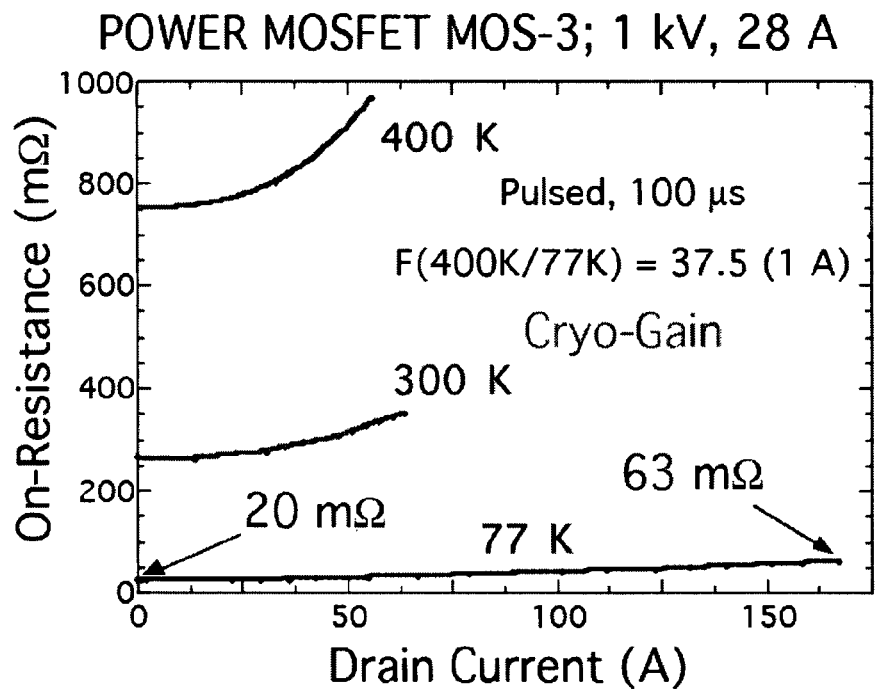
FIG. 2 shows the performance of a cryo-MOSFET, namely, on-resistance, as a function of drain current.

For the bi-directional MOSFET switches, high performance cryo-MOSFETs parts similar to those characterized in FIG. 2 were used. Results are shown for IGBT and MOSFET bi-directional switches at 300 K and at 77 K. In accordance with the invention, a MOSFET-based bi-directional switch, similar to that shown in FIG. 3, operates at cryogenic temperatures for improved performance, indicated in the measurements of FIG. 4.

FIG. 4 demonstrates that at low currents, when both MOSFETs are turned on, the lowest voltage drop (hence the lowest power dissipation) across the switch is observed. The reason is that in the on-state, MOSFETs conduct current in both directions, effectively shunting current from their protective body diodes. At higher currents, the on-state voltage increases and eventually reaches the diode threshold voltage. Once the diode threshold voltage is reached, the body diode clamps the voltage and "hogs" the current. This effect can be offset by adding more MOSFETs in parallel, effectively reducing the on-state resistance and the corresponding on-state voltage. This reduction in bi-directional on-state voltage for the MOSFET is even more pronounced at 77 K because at low temperatures, the MOSFET device has a lower on-state resistance. This low resistance shunts the current though the MOSFET away from the body diode even at relatively high currents. This effect proves useful in producing ultra-low loss bi-directional switches up to a given current level.

As the data in FIG. 4 shows, this circuit construction does not work well for IGBTs and one cannot parallel IGBTs to reduce their on-state voltage.

Several bi-directional switches may be combined to form a switch matrix for a bi-directional converter such as those described in the literature [2, 3, 4]. The cryogenic bi-directional converter topology will be a derivative of the more conventional room temperature topologies but will have important added features.

REFERENCES

1. R. J. Thome, E. Bowles, M. J. Hennessy, E. K. Mueller, M. J. Gouge, and P. Lopez, "Power Conversion System Benefits of Reduced Temperature Operation", *Electric Machine Technology Symposium* (*EMTS*-2004), 27-29 Jan. 2004.
2. Chang, J, Tom Sum, Anhua Wang "Highly Compact AC-AC Converter Achieving High Voltage Transfer Ratio" IEEE Transactions on Power Electronics (IES), 2 Apr. 2002.
3. Klumpner, Christian and Frede Blaabjberg "Experimental Evaluation of Ride-Through Capabilities for a Matrix Converter under Short Power Interruptions" IEEE Transactions on Power Electronics (IES), 2 Apr. 2002.
4. Simon, O., J. Mahlein, M. Muenzer, M. Bruckmann, "Modern Solutions for Industrial Matrix Converter Applications", IEEE Transactions on Power Electronics (IES), 2 Apr. 2002.

What is claimed is:

1. A bi-directional switch, comprising:
    a first MOSFET based solid-state switch;
    a second MOSFET based solid-state switch,
    said first and second solid-state switches being connected back-to-back and operated as a bidirectional switch.

2. A bi-directional switch as in claim 1, wherein at least one said solid-state switch includes a power MOSFET having an intrinsic body diode.

3. A bi-directional switch as in claim 1, wherein each said solid-state switch includes a power MOSFET having an intrinsic body diode.

4. A bi-directional switch as in claim 1, wherein at least one said solid-state switch has enhanced performance at cryogenic temperature.

5. A bi-directional switch as in claim 2, wherein at least one said solid-state switch has enhanced performance at cryogenic temperature.

6. A bi-directional switch as in claim 3, wherein at least one said solid-state switch has enhanced performance at cryogenic temperature.

* * * * *